(12) United States Patent
Nakai et al.

(10) Patent No.: US 8,197,659 B2
(45) Date of Patent: Jun. 12, 2012

(54) PLATING APPARATUS, PLATING METHOD AND MULTILAYER PRINTED CIRCUIT BOARD

(75) Inventors: Toru Nakai, Ibi-gun (JP); Satoru Kawai, Ibi-gun (JP); Hiroshi Niwa, Ibi-gun (JP); Yoshiyuki Iwata, Ibi-gun (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 0 days.

(21) Appl. No.: 13/240,626

(22) Filed: Sep. 22, 2011

(65) Prior Publication Data

US 2012/0005888 A1   Jan. 12, 2012

Related U.S. Application Data

(60) Continuation of application No. 12/342,772, filed on Dec. 23, 2008, which is a division of application No. 11/232,906, filed on Sep. 23, 2005, now Pat. No. 7,481,909.

(30) Foreign Application Priority Data

Sep. 24, 2004   (JP) ................................. 2004-277316
Sep. 24, 2004   (JP) ................................. 2004-277317

(51) Int. Cl.
*C25D 5/06* (2006.01)
*C25D 5/08* (2006.01)
*C25D 5/22* (2006.01)
*H05K 3/02* (2006.01)
*H05K 3/06* (2006.01)
*H05K 3/42* (2006.01)

(52) U.S. Cl. .......... 205/93; 205/125; 205/126; 205/131; 205/133; 205/187; 205/195; 205/221; 205/223; 205/291; 430/318

(58) Field of Classification Search ..................... 205/93
See application file for complete search history.

(56) References Cited

U.S. PATENT DOCUMENTS 3,652,442 A   3/1972   Powers et al.
(Continued)

FOREIGN PATENT DOCUMENTS

JP   57-057896 A   4/1982
(Continued)

OTHER PUBLICATIONS

Patent Abstracts of Japan, JP 58-006999, Jan. 14, 1983.
(Continued)

*Primary Examiner* — Harry D Wilkins, III
(74) *Attorney, Agent, or Firm* — Oblon, Spivak, McClelland, Maier & Neustadt, L.L.P.

(57) ABSTRACT

A method for manufacturing a multilayer printed circuit board including providing a core substrate having a penetrating-hole, forming an electroless plated film on a surface of the substrate and an inner wall surface of the penetrating-hole, electrolytically plating the substrate while moving with respect to the surface of the substrate an insulating member in contact with the surface of the substrate such that an electrolytic plated film is formed on the electroless plated film, an opening space inside the penetrating-hole is filled with an electrolytic material, and a through-hole conductor structure is formed in the penetrating-hole, forming an etching resist having an opening pattern on the electrolytic plated film, and removing an exposed pattern of the electrolytic plated film exposed by the opening pattern and a pattern of the electroless plated film under the exposed pattern such that a conductor circuit is formed on the surface of the substrate.

11 Claims, 14 Drawing Sheets

U.S. PATENT DOCUMENTS

| | | | |
|---|---|---|---|
| 4,073,699 A | 2/1978 | Hutkin | |
| 4,102,756 A | 7/1978 | Castellani et al. | |
| 4,174,261 A * | 11/1979 | Pellegrino | 204/273 |
| 4,875,982 A * | 10/1989 | Velie | 205/50 |
| 4,964,948 A | 10/1990 | Reed | |
| 5,024,735 A | 6/1991 | Kadija | |
| 5,229,549 A | 7/1993 | Yamakawa et al. | |
| 5,342,207 A * | 8/1994 | Sobhani | 439/74 |
| 5,440,075 A | 8/1995 | Kawakita et al. | |
| 5,468,681 A * | 11/1995 | Pasch | 438/108 |
| 6,174,417 B1 * | 1/2001 | Henington et al. | 204/198 |
| 6,174,418 B1 | 1/2001 | Ohba | |
| 6,241,860 B1 * | 6/2001 | Huang et al. | 204/224 R |
| 6,303,014 B1 * | 10/2001 | Taylor et al. | 205/103 |
| 6,322,684 B1 | 11/2001 | Hodko et al. | |
| 6,376,049 B1 * | 4/2002 | Asai et al. | 428/209 |
| 6,395,163 B1 * | 5/2002 | Schneider et al. | 205/93 |
| 6,534,116 B2 | 3/2003 | Basol | |
| 6,607,652 B2 | 8/2003 | Webb et al. | |
| 6,802,761 B1 | 10/2004 | Beaucage et al. | |
| 6,863,209 B2 | 3/2005 | Rinne et al. | |
| 7,160,428 B2 | 1/2007 | Fujimoto | |
| 7,163,613 B2 | 1/2007 | Hashimoto | |
| 7,230,188 B1 * | 6/2007 | En et al. | 174/257 |
| 7,238,092 B2 | 7/2007 | Basol et al. | |
| 7,481,909 B2 | 1/2009 | Nakai et al. | |
| 7,947,161 B2 * | 5/2011 | Gebhart et al. | 205/96 |
| 2002/0074230 A1 * | 6/2002 | Basol | 205/93 |
| 2002/0074381 A1 * | 6/2002 | Rinne et al. | 228/194 |
| 2002/0096435 A1 * | 7/2002 | Matsuda et al. | 205/117 |
| 2003/0010642 A1 * | 1/2003 | Taylor et al. | 205/103 |
| 2003/0029729 A1 * | 2/2003 | Cheng et al. | 205/125 |
| 2003/0064669 A1 * | 4/2003 | Basol et al. | 451/259 |
| 2005/0167275 A1 | 8/2005 | Keigler et al. | |
| 2006/0065534 A1 * | 3/2006 | Nakai et al. | 205/118 |
| 2009/0001550 A1 * | 1/2009 | Li et al. | 257/700 |
| 2009/0029037 A1 | 1/2009 | Nakai et al. | |
| 2009/0218119 A1 | 9/2009 | Nakai et al. | |
| 2009/0218125 A1 | 9/2009 | Nakai et al. | |
| 2011/0272286 A1 | 11/2011 | Nakai et al. | |

FOREIGN PATENT DOCUMENTS

| | | |
|---|---|---|
| JP | 63-270497 A | 11/1988 |
| JP | 05-230691 A | 9/1993 |
| JP | 06-146066 | 5/1994 |
| JP | 07-180092 | 7/1995 |
| JP | 08-144086 A | 6/1996 |
| JP | 2000-232078 A | 8/2000 |
| JP | 2000-239892 A | 9/2000 |
| JP | 2003-183883 A | 7/2003 |
| JP | 2004-225119 A | 8/2004 |
| JP | 2005-113173 A | 4/2005 |
| JP | 2005-520044 | 7/2005 |
| TW | 559922 | 11/2003 |
| WO | WO 03/009361 A2 | 1/2003 |
| WO | WO 03/028048 A2 | 4/2003 |
| WO | WO 2006/033315 A1 | 3/2006 |

OTHER PUBLICATIONS

Patent Abstracts of Japan, JP 06-146066, May 27, 1994.
Patent Abstracts of Japan, JP 07-180092, Jul. 18, 1995.
Patent Abstracts of Japan, JP 63-297588, Dec. 5, 1988.
Patent Abstracts of Japan, JP 2002-047594, Feb. 15, 2002.
Patent Abstracts of Japan, JP 09-130050, May 16, 1997.

* cited by examiner

| | THE FILLING STATE IN THE VIA HOLE | THE PROPERTY | THE VALUE OF RESISTANCE | THE HEAT CYCLE TEST |
|---|---|---|---|---|
| EXAMPLE 1-1-1 | ○ | ○ | ○ | ○ |
| EXAMPLE 1-1-2 | ○ | ○ | ○ | ○ |
| EXAMPLE 1-1-3 | ○ | ○ | ○ | ○ |
| EXAMPLE 1-2-1 | ○ | ○ | ○ | ○ |
| EXAMPLE 2-1-1 | ○ | ○ | ○ | ○ |
| EXAMPLE 2-2-1 | ○ | ○ | ○ | ○ |
| EXAMPLE 3-1-1 | ○ | ○ | ○ | ○ |
| EXAMPLE 3-2-1 | ○ | ○ | ○ | ○ |
| EXAMPLE 4-1-1 | ○ | ○ | ○ | ○ |
| EXAMPLE 4-2-1 | ○ | ○ | ○ | ○ |
| EXAMPLE 5-1-1 | ○ | ○ | ○ | ○ |
| EXAMPLE 5-2-1 | ○ | ○ | ○ | ○ |
| COMPARATIVE EXAMPLE | × | × | ○ | × |

*FIG. 13*

PLATING APPARATUS, PLATING METHOD AND MULTILAYER PRINTED CIRCUIT BOARD

CROSS-REFERENCE TO RELATED APPLICATIONS

The present application is a continuation of and claims the benefit of priority to U.S. application Ser. No. 12/342,772, filed Dec. 23, 2008, which is a divisional of U.S. application Ser. No. 11/232,906, filed Sep. 23, 2005, now U.S. Pat. No. 7,481,909, issued Jan. 27, 2009, which claims priority under 35 U.S.C. §119 to Japanese Patent Application No. 2004-277316, filed Sep. 24, 2004, entitled "Plating Apparatus" and Japanese Patent Application No. 2004-277317, filed Sep. 24, 2004, entitled "Plating Method." The contents of these applications are incorporated herein by reference in their entirety. PCT/JP2005/17257 was filed Sep. 20, 2005 claiming priorities under Paris Convention to Japanese Patent Application No. 2004-277316 and Japanese Patent Application No. 2004-277317. The contents of PCT/JP2005/17257 are incorporated herein by reference in their entirety.

BACKGROUND OF THE INVENTION

1. Field of the Invention

The present invention relates to a plating apparatus, a plating method and a multilayer printed circuit board.

2. Discussion of the Background

Japanese Unexamined Patent Application Publication No. 9-130050 discloses build-up multilayer printed circuit boards including filled vias. The contents of this application are incorporated herein by reference in their entirety.

Japanese Unexamined Patent Application Publication No. 2002-47594 (hereinafter referred as "the '594 publication") discloses a method for manufacturing a multilayer printed circuit board having via holes which connect conductor layers provided on opposite sides of an insulation layer. The '594 publication further discloses that the upper surface of the via hole and the upper surface of the conductive circuit are formed on the same plane by using an electrolytic solution containing 50 to 300 g/l of copper sulfate, 30 to 200 g/l of sulfuric acid, 25 to 90 mg/l of chlorine ion, and 1 to 1,000 mg/l of an additive composed of at least a leveling agent and a brightener. The contents of this application are incorporated herein by reference in their entirety.

SUMMARY OF THE INVENTION

According to one aspect of the present invention, a multilayer printed circuit board includes an insulation layer, a first conductor layer provided on a first side of the insulation layer, a second conductor layer provided on a second side of the insulation layer opposite to the first side, and multiple filled vias electrically connecting the first conductor layer and the second conductor layer. The filled vias have upper surfaces, respectively, and each of the upper surfaces is made such that a difference between a lowest point and a highest point of each of the upper surfaces is less than or equal to about 7 μm.

According to another aspect of the present invention, multilayer printed circuit board includes an insulation layer, a first conductor layer provided on a first side of the insulation layer, a second conductor layer provided on a second side of the insulation layer opposite to the first side, and multiple filled vias electrically connecting the first conductor layer and the second conductor layer. Each of the filled vias is formed by electrically plating the insulating layer while moving one of the insulating layer and an insulating member placed to cover a surface on one of the first side and the second side of the insulating layer in a plating bath relative to each other.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 13 shows a test result;

DESCRIPTION OF THE EMBODIMENTS

Figure 1A:
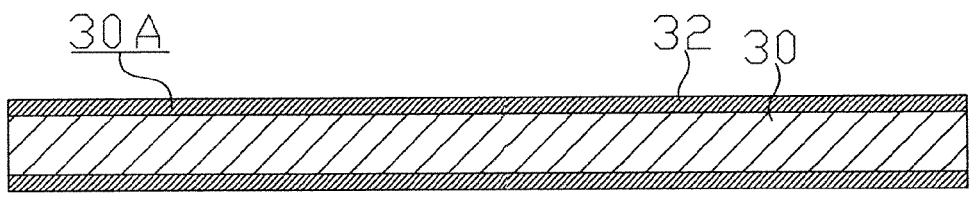
FIGS. 1A-1D illustrate a process for manufacturing a multilayer printed circuit board according to an embodiment of the present invention.

The embodiments will now be described with reference to the accompanying drawings, wherein like reference numerals designate corresponding or identical elements throughout the various drawings.

Figure 9:
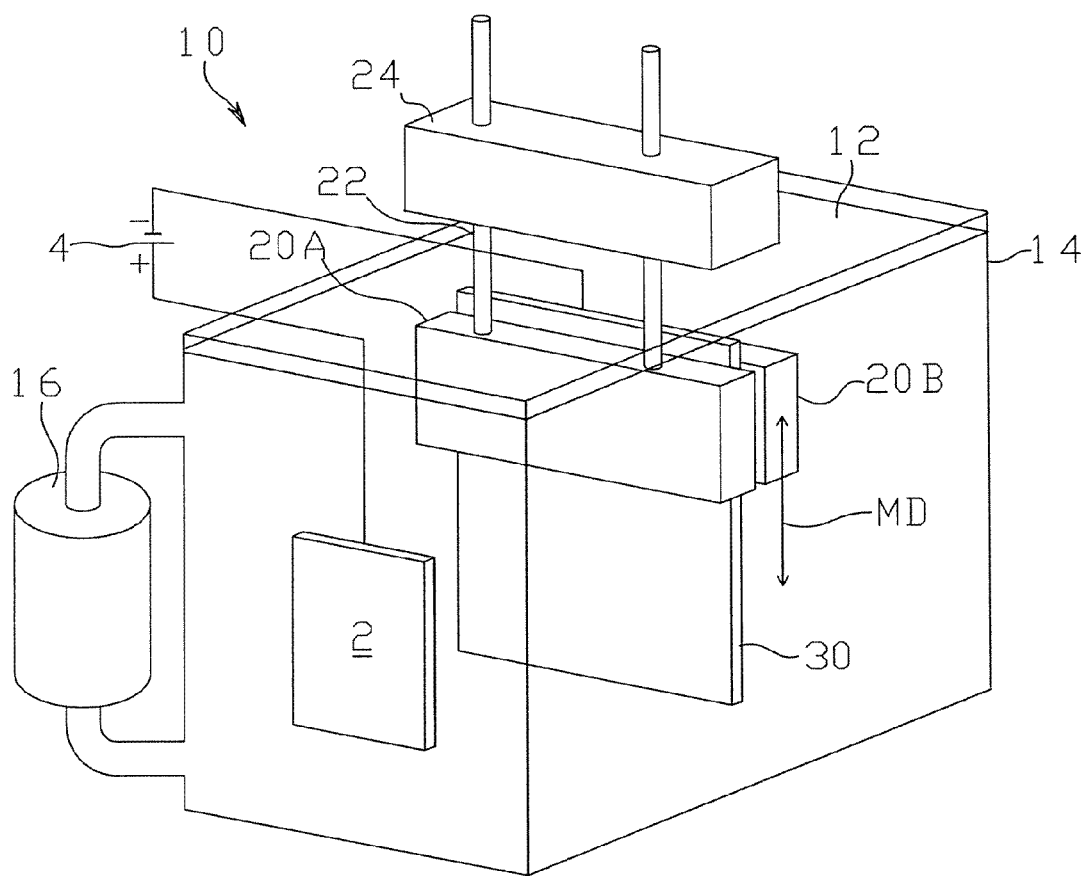
FIG. 9 is a schematic perspective view of a plating apparatus according to an embodiment of the present invention.

FIG. 9 shows a plating apparatus according to an embodiment of the present invention. Referring to FIG. 9, a plating apparatus 10 includes a plating bath 14 filled in with a plating solution 12, a circulation device 16 to circulate the plating solution 12, a member 20A to be brought into contact with a plating surface on the front side of a printed circuit board 30, a member 20B to be brought into contact with a plating surface on the back side, and a moving device 24 to move the members 20A and 20B upward and downward along the respective surfaces of the printed circuit board 30 via a lifting rod 22. Preferably, the members 20A and 20B are made of an insulating material, for example, a porous resin (sponge). An electrode 2 is provided in the plating bath 14. The plating surface is connected to a negative pole of a direct current electric power source 4 and the electrode 2 is connected to a positive pole of the direct current electric power source 4.

Build-up multilayer printed circuit boards are produced according to the following method. In this method, penetration holes are formed in a copper faced laminate to which copper foil has been applied, and subsequently, an electroless copper plating treatment is conducted, so that through holes are formed. The surface of the substrate is subjected to an etching treatment and, thereby, is made into the shape of a conductor pattern to form a conductor circuit. A roughened surface is formed on the surface of this conductor circuit by electroless plating, etching, or the like. After a resin insulating layer is formed on the conductor circuit having the roughened surface, treatments, e.g., exposure and development, are conducted to form openings for via hole. Thereafter, an interlayer resin insulating layer is formed through ultraviolet curing and main curing.

Figure 14A:
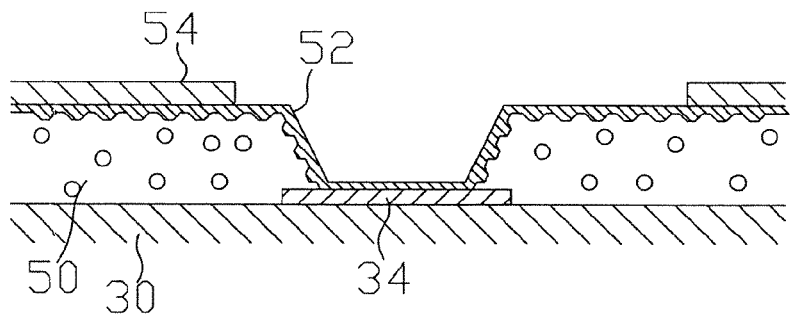
FIGS. 14A-14D illustrate a process for manufacturing a multilayer printed circuit board according to an embodiment of the present invention.
Figure 14B:
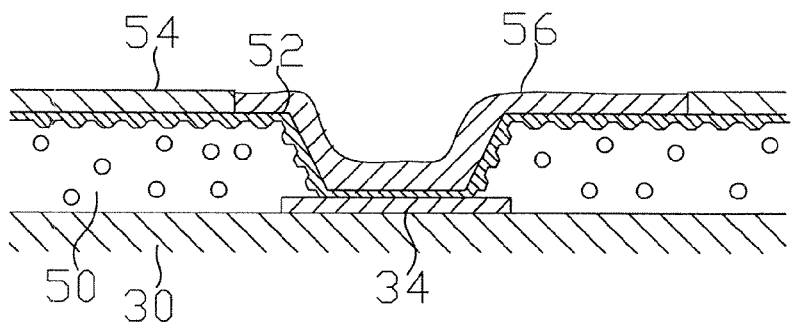
Figure 14C:
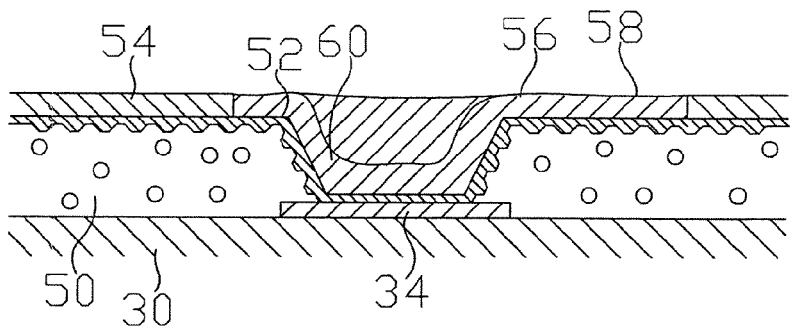
Figure 14D:
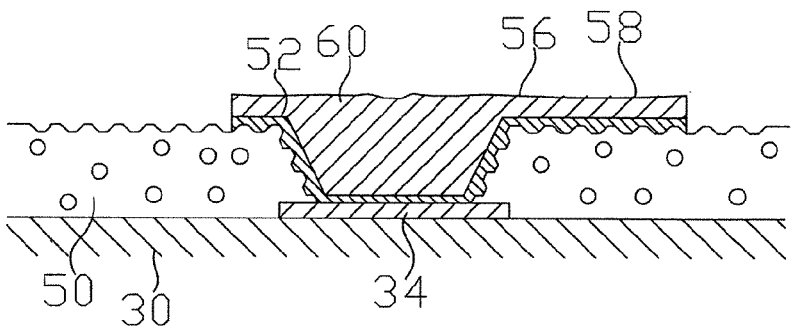

Then, as shown in FIG. 14A, the interlayer resin insulating layer 50 is subjected to a roughening treatment with an acid, an oxidizing agent, or the like and, subsequently, a thin metal layer 52 is formed. After a plating resist 54 is formed on this metal layer, as shown in FIG. 14B, a thick electrolytic plating film 56 is applied by electrolytic plating. As shown in FIG. 14C, the electrolytic plating is continued to fill a via hole 60 to form a filled via. Then, as shown in FIG. 14D, the plating resist film 54 is peeled off and, thereafter, the metal film 52 is removed by etching, so that a conductor circuit 58 is connected to the lower layer conductor circuit 34 through a via hole 60.

After this process is repeated, finally, a solder resist layer to protect the conductor circuit is formed. Portions at which the openings are exposed to connect to electronic components, e.g., IC chips, a mother board, and the like are subjected to plating or the like and, thereafter, solder bumps are formed by printing a solder paste, so that the production of a build-up multilayer printed circuit board is completed.

Not only in production of such a build-up multilayer printed circuit board, but also in a blind hole and a penetration hole by a subtractive process, interlayer electrical connection has been performed through electroless plating and electrolytic plating.

These technologies for forming a filled via can be applied to via holes, blind via holes, penetration holes, and the like in printed circuit boards formed by not only the above-described additive method, but also the subtractive method.

Figure 15:
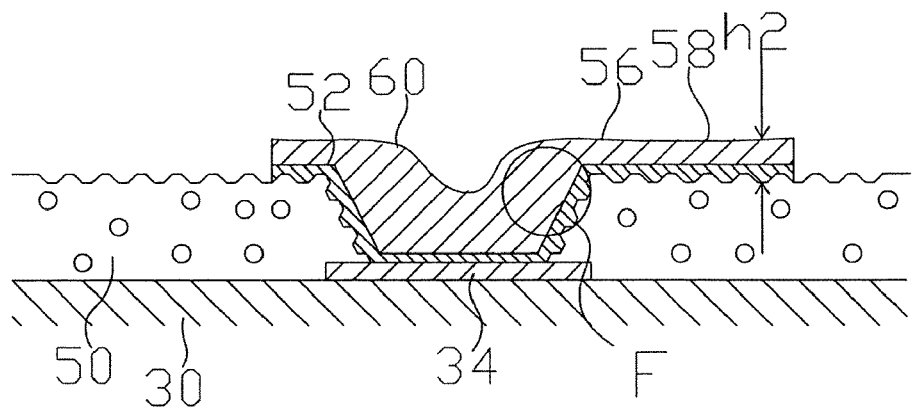
FIG. 15 is a cross-sectional view of a filled via of background art.

A build-up multilayer printed circuit board usually has plural via holes. Even though the filled via is produced to have a flat surface as shown in FIG. 14D, all the filled vias in a build-up multilayer printed circuit board necessarily have flat surfaces. Some or many filled vias have recesses, as shown in FIG. 15. The filled via having a dent is not a desired shape in the case where a via is laminated as an upper layer in a stack via or a conductor circuit is disposed as an upper layer, and deformation may occur. Therefore, electrical properties may be deteriorated, or electrical connectivity may be deteriorated since the circuit is damaged by a break or the like.

When a reliability test is conducted on a high-temperature high-humidity condition or a heat cycle condition, breaking, cracking, or the like occurs in an insulating layer or a conductor layer (including a stack via) in the vicinity of the filled via with the dent, deterioration occurs at an early stage, and the reliability of the substrate itself is reduced.

Furthermore, in the case where the via hole is formed to have a diameter of 150 µm or less or the distance between adjacent via holes becomes a small pitch, there is a tendency to form a dent in the filled via.

As for an insulating base material, the right side and the back side are electrically connected by forming a plating film in a through hole, that is a penetration hole. At this time, the plating film is formed by electrolytic plating. In this case as well, the plating film in the penetration hole may become nonuniform, or the growth of plating film may be stopped, so that a portion provided with no plating film may be present. Therefore, the shape of the formed plating film may not become a desired shape, or the circuit in the penetration hole may be deformed resulting from the nonuniformity in thickness of the plating film. Consequently, electrical properties may be deteriorated, or electrical connectivity may be deteriorated since the circuit is damaged by a break or the like.

When a reliability test is conducted on a high-temperature high-humidity condition or a heat cycle condition, breaking, cracking, or the like occurs in a plating film formed in the penetration hole, deterioration occurs at an early stage, and the reliability of the substrate itself is reduced.

In particular, in the case where a plating film is formed in a through hole that is a penetration hole having a diameter of less than 300 µm, or the penetration hole is filled in with plating, the above-described inconveniences in the plating film tend to occur.

Figure 11A:
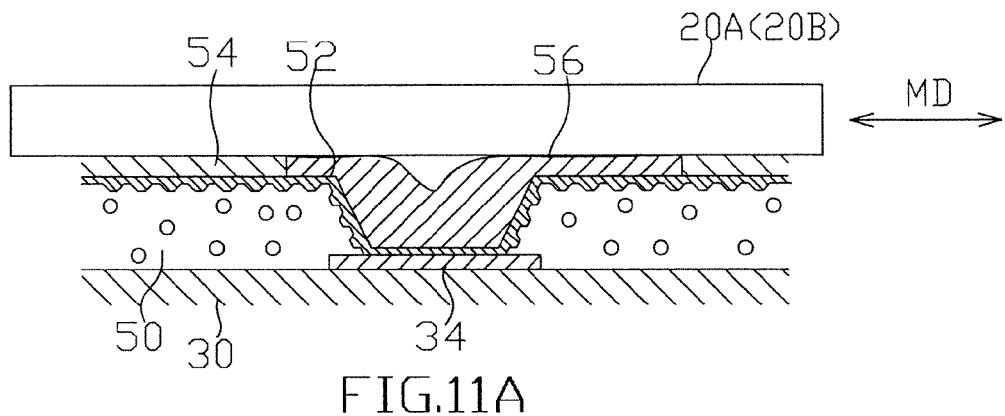
FIGS. 11A-11C illustrate a process for manufacturing a multilayer printed circuit board according to an embodiment of the present invention.
Figure 11B:
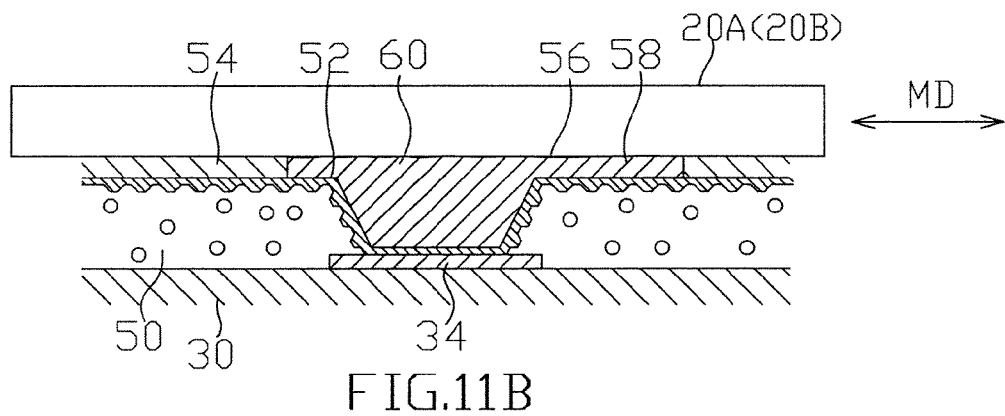

The plating method according to an embodiment of the present invention will be described with reference to FIGS. 11A-11C. In FIGS. 11A and 11B, the members 20A and 20B reciprocally move along the motion direction MD. FIG. 11A shows a state in which a metal layer 52 is formed on an interlayer insulating layer 50, a plating resist 54 is formed on this metal layer 52 and, thereafter, a thick electrolytic plating film 56 is applied by electrolytic plating with the plating apparatus 10 shown in FIG. 9, according to the technology described above with reference to FIGS. 14A-14D.

In Example 1-1-1, when the thickness of the electrolytic plating film 56 is increased, the members 20A and 20B are brought into contact or partial contact with the plating target surface according to the motion of the members 20A and 20B. At the portion where the members 20A and 20B contact the plating target surface, the growth of the electrolytic plating film 56 becomes slow or the growth of the plating film is stopped since the plating target surface is covered by the members 20A and 20B. On the other hand, the electrolytic plating film 56 grows at the portion where the members 20A and 20B do not contact the plating target surface. Consequently, as shown in FIG. 11B, a filled via 60 having a substantially flat surface can be produced.

The plating grows at an open portion of the via hole, and a conductor circuit 58 that is a conductor portion other than the via hole does not become too thick. That is, the plating is formed reliably in the via hole, whereas a plating film having a relatively small thickness can be formed at the conductor circuit 58. In this manner, a higher density conductor circuit can be formed. In particular, when a conductor circuit is formed all over the surface and the conductor circuit is formed by etching, the conductor circuit can be formed at a fine pitch and, therefore, there is an advantage in increasing a density.

Furthermore, the liquid flow of the plating solution, in particular, the liquid flow around the via hole can be directed in a substantially constant direction by the members 20A and 20B made of a porous resin (sponge). Therefore, variations in formation of the plating film on the periphery of the via hole can be substantially eliminated. Consequently, in the case where a via hole is formed, the via hole has a substantially flat surface.

Figure 11C:
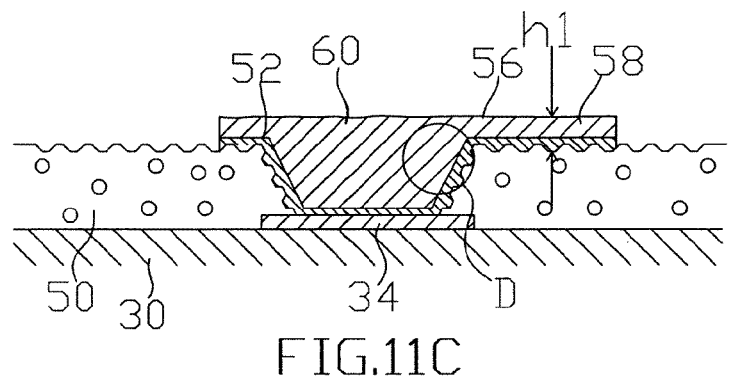
Figure 12:
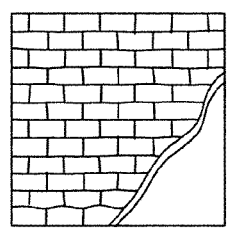
FIG. 12 is an enlarged view of a portion indicated by a circle D in FIG. 11C.

FIG. 11C shows a state in which after the electrolytic plating film 56 is formed, the resist 54 is peeled off, the metal layer 52 is removed by etching, so that a conductor circuit 58 connected to a lower layer conductor circuit 34 through a via hole 60 is formed. FIG. 12 is a magnified sketch of a site of the electrolytic plating film 56 indicated by a circle D shown in FIG. 11C.

As shown in FIG. 12, a crystal structure of copper is aligned by the plating apparatus in Example 1-1-1. This is believed because the liquid flow around the via hole can be directed in a substantially constant direction by the members 20A and 20B made of the porous resin (sponge).

Figure 16:
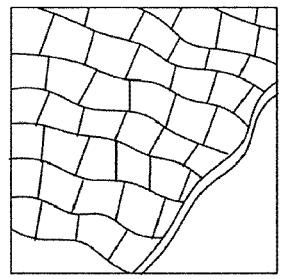
FIG. 16 is an enlarged view of a portion indicated by a circle F in FIG. 15.

FIG. 16 is a magnified sketch of a site of the electrolytic plating film 56 of the filled via 60 based on the known technology, the site indicated by a circle F shown in FIG. 15. In the known technology, the crystal structure of copper is not aligned neatly in contrast to that in Example 1-1-1 shown in FIG. 12.

The production of a multilayer printed circuit board by using the plating apparatus according to the embodiment of the present invention will be described with reference to FIG. 1A to FIG. 6.

Figure 6:
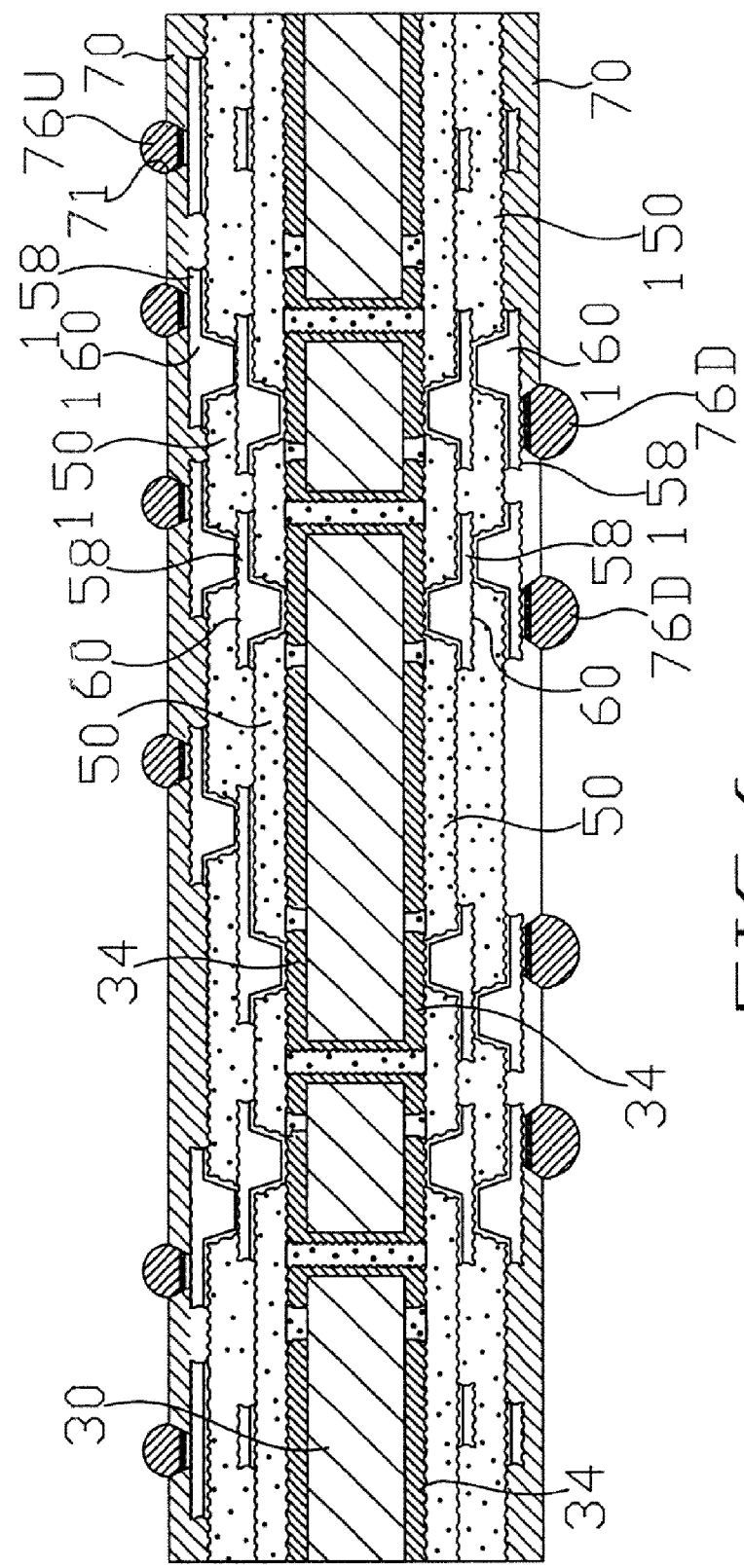
FIG. 6 is a cross-sectional view of a multilayer printed circuit board according to an embodiment of the present invention.

FIG. 6 is a sectional view showing the configuration of a multilayer printed circuit board. In the multilayer printed circuit board, conductor circuits 34 are disposed on the surface and the back of a core substrate 30. Furthermore, interlayer resin insulating layers 50 provided with via holes 60 and conductor circuits 58 and interlayer resin insulating layers 150 provided with via holes 160 and conductor circuits 158 are disposed on the conductor circuits 34. Solder resist layers 70 are disposed as a layer on the via holes 160 and the conductor circuits 158. Bumps 76U and 76D are disposed on the via holes 160 and the conductor circuits 158 through openings 71 of the solder resist layers 70.

A production process of the multilayer printed circuit board shown in FIG. 6 will be described below.

A. Production of Resin Film of Interlayer Resin Insulating Layer

An epoxy resin composition is prepared by heat-dissolving 30 parts by weight of bisphenol A type epoxy resin (epoxy equivalent 469, Epicoat 1001 produced by Yuka Shell Epoxy Co., Ltd.), 40 parts by weight of cresol novolac type epoxy resin (epoxy equivalent 215, EPICLON N-673 produced by DAINIPPON INK AND CHEMICALS, INCORPORATED), and 30 parts by weight of triazine structure containing phenol novolac resin (phenolic hydroxyl equivalent 120, Phenolite KA-7052 produced by DAINIPPON INK AND CHEMICALS, INCORPORATED) into 20 parts by weight of ethyl diglycol acetate and 20 parts by weight of solvent naphtha through agitation, and adding thereto 15 parts by weight of epoxy-terminated polybutadiene rubber (DENAREX R-45EPT produced by Nagase Chemicals Ltd.), 1.5 parts by weight of ground product of 2-phenyl-4,5-bis-(hydroxymethyl)imidazole, 2 parts by weight of pulverized silica, and 0.5 parts by weight of silicon based antifoaming agent.

The resulting epoxy resin composition is applied by using a roll coater to a PET film of 38 μm in thickness in order that the thickness becomes 50 μm after drying. Thereafter, drying is performed at 80° C. to 120° C. for 10 minutes, so that a resin film for interlayer resin insulating layer is produced.

B. Preparation of Resin Filler

A resin filler having a viscosity of 44 to 49 Pa·s at 23±1° C. is prepared by putting 100 parts by weight of bisphenol F type epoxy monomer (molecular weight 310, YL983U produced by Yuka Shell Epoxy Co., Ltd.), 170 parts by weight of $SiO_2$ spherical particles having an average particle diameter of 1.6 μm (CRS1101-CE produced by ADTEC Co., Ltd.) in which surfaces are coated with a silane coupling agent and the diameter of a maximum particle is 15 μm or less, and 1.5 parts by weight of leveling agent (PERENOL S4 produced by San Nopco Limited) into a container, followed by agitation and mixing. As for a curing agent, 6.5 parts by weight of imidazole curing agent (2E4MZ-CN produced by SHIKOKU CORPORATION) is used.

Figure 1B:
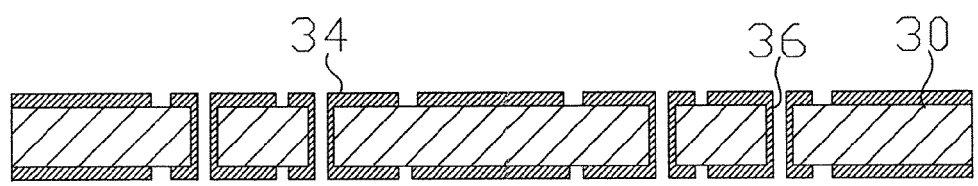

C. Production of Multilayer Printed Circuit Board (1) A copper faced laminated sheet 30A in which copper foil 32 of 18 μm is laminated on both surfaces of an insulating substrate 30 of 0.8 mm in thickness made of a glass epoxy resin or a BT (bismaleimide triazine) resin is used as a starting material (FIG. 1A). Holes are bored with a drill in this copper faced laminated sheet, an electroless plating treatment is conducted, and etching into the pattern shape is conducted, so that lower layer conductor circuits 34 and through holes 36 are formed on both surfaces of the substrate 30 (FIG. 1B).

Figure 1C:
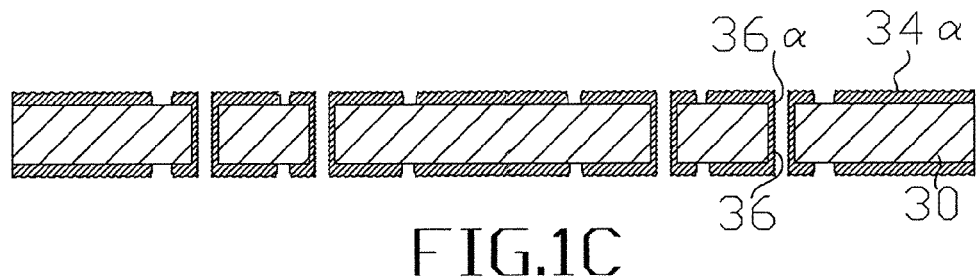

(2) The substrate 30 provided with the through holes 36 and the lower layer conductor circuits 34 is washed with water and dried. Thereafter, a blackening treatment by using an aqueous solution containing NaOH (10 g/l), $NaClO_2$ (40 g/l), and $Na_3PO_4$ (6 g/l) as a blackening bath (oxidation bath) is conducted and a reduction treatment by using an aqueous solution containing NaOH (10 g/l) and $NaBH_4$ (6 g/l) as a reduction bath is conducted, so that roughened surfaces 36α and 34α are formed all over the surface of the lower layer conductor circuits 34 including the through holes 36 (FIG. 1C).

Figure 1D:
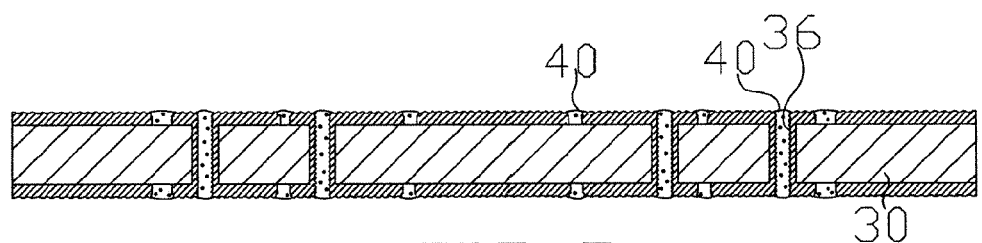

(3) After the resin filler in the above-described item B is prepared, layers of resin filler 40 are formed in the through holes 36, on the portions provided with no lower layer conductor circuit 34 on one surface of the substrate, and on the outer edge portions of the lower layer conductor circuits within 24 hours after the preparation in the procedure described below (FIG. 1D).

That is, a mask for resin filling, having a pattern in which openings are disposed at positions corresponding to the through holes and portions provided with no lower layer conductor circuit, is placed on the substrate, and the through holes, the concave portions provided with no lower layer conductor circuit, and the outer edge portions of the lower layer conductor circuits are filled in with the resin filler 40 by using a squeegee, followed by drying on the condition of 100° C. and 20 minutes.

Figure 2A:
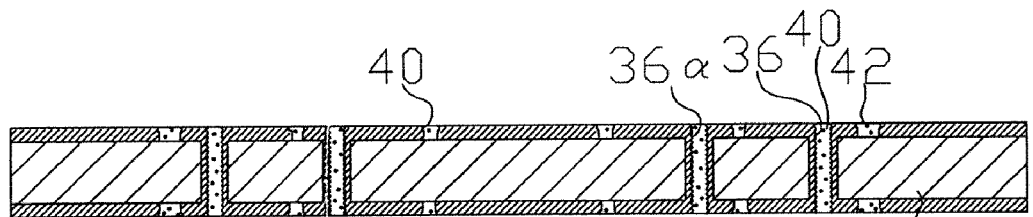
FIGS. 2A-2E illustrate the process for manufacturing the multilayer printed circuit board according to the embodiment of the present invention.

(4) The one surface of the substrate after undergoing the treatment of the above-described item (3) is polished by belt sanding through the use of a #600 belt sandpaper (produced by Sankyo Rikagaku Co., Ltd.) in such a manner that the resin filler is not left on the outer edge portion of the lower layer conductor circuit 34 or on the outer edge portion of the land of the through hole 36. Subsequently, buffing is conducted all over the lower layer conductor circuits (including land surfaces of the through holes) in order to eliminate flaws due to the above-described belt sanding (FIG. 2A). The above-described series of polishing is conducted similarly with respect to the other surface of the substrate.

Then, a heat treatment is conducted at 100° C. for 1 hour, and at 150° C. for 1 hour to cure the resin fillers 40.

In this manner, the surface portions of the resin filler 40 disposed in the through holes 36 and the portions provided with no lower layer conductor circuit 34 and the surfaces of the lower layer conductor circuits 34 are flattened. Consequently, in the resulting substrate, the resin filler and the side surfaces of the lower layer conductor circuits are strongly adhered through the roughened surfaces, and the inner wall surfaces of the through holes 36 and the resin fillers 40 are strongly adhered through the roughened surfaces. That is, by this step, the surfaces of the resin fillers 40 become substantially flush with the surfaces of the lower layer conductor circuits 34.

Figure 2B:
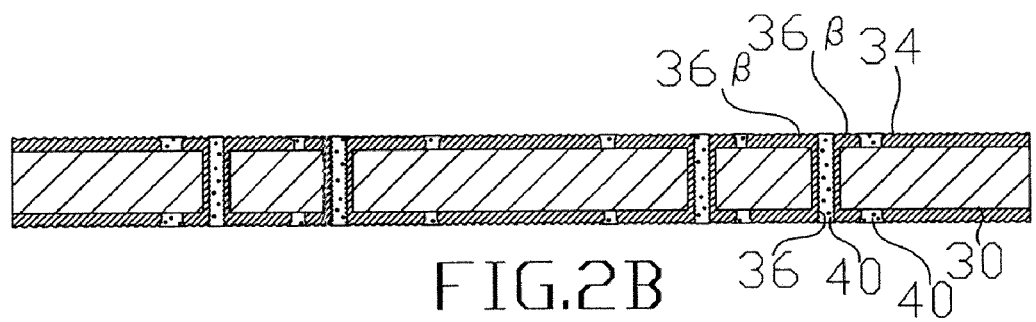

(5) The above-described substrate is washed with water and degreased with acid, followed by soft etching. Thereafter, an etching solution is blown with a spray on both surfaces of the substrate to etch the surfaces of the lower layer conductor circuits 34 and the land surfaces and inner walls of the through holes 36, so that roughened surfaces 36β are formed all over the lower layer conductor circuits 34 (FIG. 2B).

The etching solution used is an etching solution (MECetchBOND produced by MEC COMPANY LTD.) composed of 10 parts by weight of imidazole copper(II) complex, 7 parts by weight of glycolic acid, and 5 parts by weight of potassium chloride.

Figure 2C:
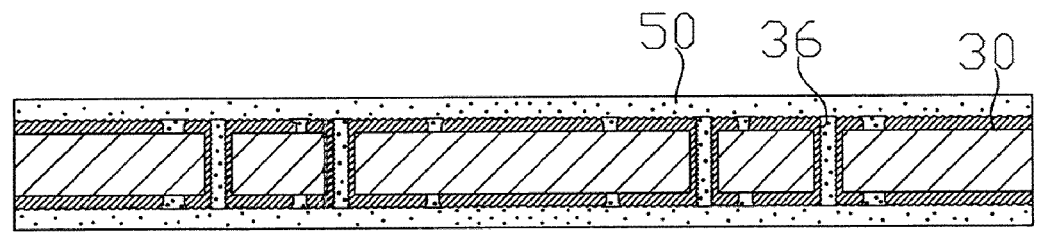

(6) Resin films produced as described in item A, which are somewhat larger than the substrate and which are to form interlayer resin insulating layers, are placed on both surfaces of the substrate 30, and are temporarily pressure-bonded on the condition that the pressure is 0.4 MPa, the temperature is 80° C., and the pressure-bonding time is 10 seconds, followed by cutting. Subsequently, application is conducted with a vacuum laminator by a method described below, so that interlayer resin insulating layers 50 are formed (FIG. 2C). That is, the resin films to form interlayer resin insulating layers are formally pressure-bonded on the substrate on the condition that the degree of vacuum is 67 Pa, the pressure is 0.4 MPa, the temperature is 80° C., and the pressure-bonding time is 60 seconds, followed by heat curing at 170° C. for 30 minutes.

Figure 2D:
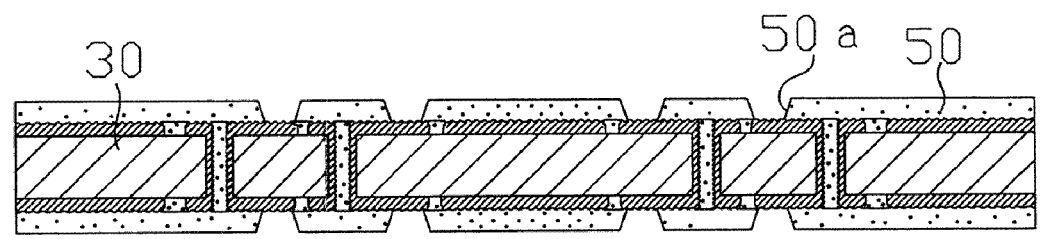

(7) Openings 50a for via hole of 80 μm in diameter are formed in the interlayer resin insulating layers by a $CO_2$ gas laser with a wavelength of 10.4 μm on the condition of the beam diameter of 4.0 mm, top hat mode, the pulse width of 8.0 microseconds, the diameter of the mask penetration hole of 1.0 mm, and 1 to 3 shots through a mask of 1.2 mm in thickness provided with penetration holes and placed on the interlayer resin insulating layer 50 (FIG. 2D).

Figure 2E:
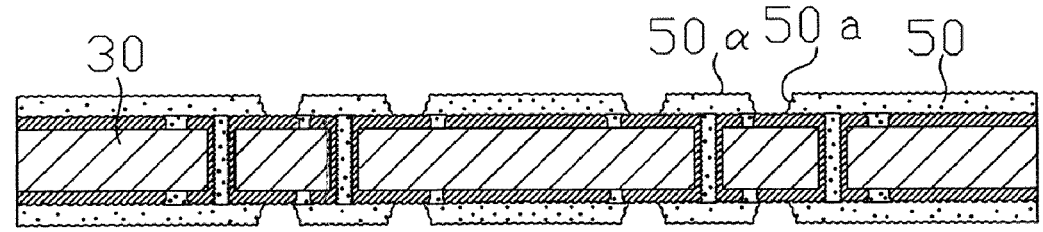

(8) The substrate 30 provided with the openings 50a for via hole is immersed in a solution containing 60 g/l of permanganic acid at 80° C. for 10 minutes and, thereby, epoxy resin particles present on the surfaces of the interlayer resin insulating layers 50 are removed by dissolution, so that the surfaces of the interlayer resin insulating layers 50 including the inner walls of the openings 50a for via hole are made to be roughened surfaces 50a (FIG. 2E).

(9) The substrate 30 after undergoing the above-described treatment is immersed in a neutralization solution (produced by Shipley), followed by washing with water.

A palladium catalyst is applied to the surface of the substrate 30 after undergoing a surface roughening treatment (roughening depth 3 μm) and, thereby, catalyst cores are attached to the surfaces of the interlayer resin insulating layers 50 and inner wall surfaces of the openings 50a for via hole (not shown in the drawing). That is, the above-described substrate is immersed in a catalyst solution containing palladium chloride (PdCl2) and stannous chloride (SnCl2), and palladium metal is deposited, so that the catalyst is applied.

Figure 3A:
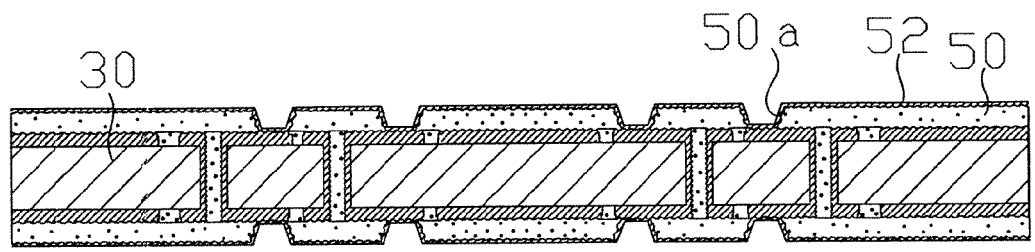
FIGS. 3A-3D illustrate the process for manufacturing the multilayer printed circuit board according to the embodiment of the present invention.

(10) The substrate provided with the catalyst is immersed in an electroless copper plating aqueous solution having the following composition, and an electroless copper plating film 52 of 0.6 to 3.0 μm in thickness is formed all over the roughened surface, so that the substrate 30 in which the electroless copper plating films 52 are formed on the surfaces of the interlayer resin insulating layers 50 including the inner walls of the openings 50a for via hole is produced (FIG. 3A).

[Electroless Plating Aqueous Solution]

| | |
|---|---|
| $NiSO_4$ | 0.003 mol/l |
| tartaric acid | 0.200 mol/l |
| copper sulfate | 0.030 mol/l |
| HCHO | 0.050 mol/l |
| NaOH | 0.100 mol/l |
| α,α'-bipyridyl | 100 mg/l |
| polyethylene glycol (PEG) | 0.10 g/l |

[Electroless Plating Conditions]

at a liquid temperature of 34° C. for 40 minutes

Figure 3B:
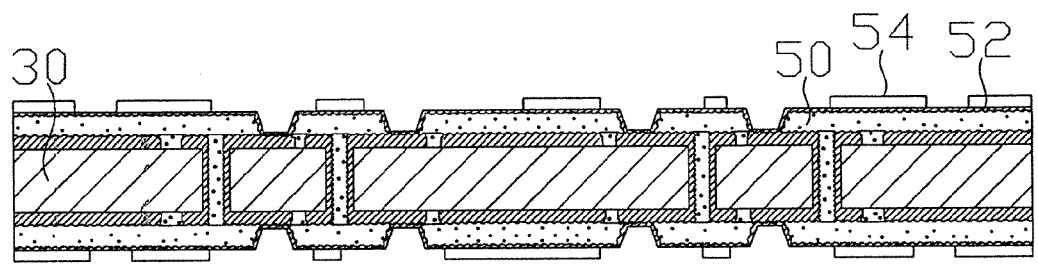

(11) A commercially available photosensitive dry film is applied to the substrate 30 provided with the electroless copper plating films 52, and a mask is placed. Exposure is conducted at 100 mJ/$cm^2$, and development is conducted with a 0.8% sodium carbonate aqueous solution, so that a plating resist 54 of 20 μm in thickness is disposed (FIG. 3B).

Figure 3C:
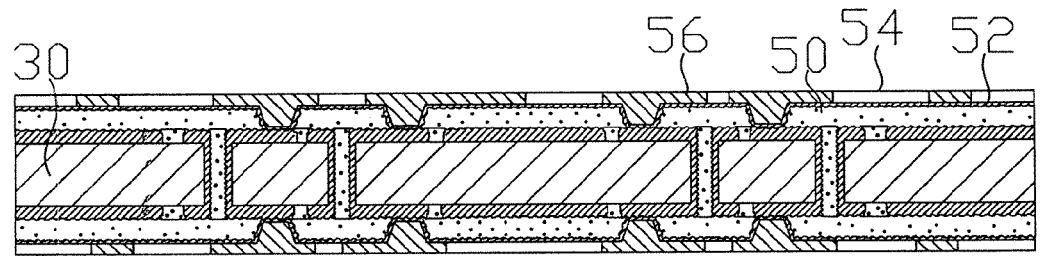

(12) The substrate 30 is washed with water at 50° C. to degrease, washed with water at 25° C., and furthermore, washed with sulfuric acid. Subsequently, electrolytic plating is conducted by using the plating apparatus 10 described above with reference to FIG. 9 on the following conditions, so that electrolytic plating films 56 are formed (FIG. 3C).

[Electrolytic Plating Solution]

| | |
|---|---|
| sulfuric acid | 2.24 mol/l |
| copper sulfate | 0.26 mol/l |
| additive | 19.5 ml/l |
| leveling agent | 50 mg/l |
| brightener | 50 mg/l |

[Electrolytic Plating Conditions]

| | |
|---|---|
| current density | 1 A/$dm^2$ |
| time | 65 minutes |
| temperature | 22° C. ± 2° C. |

At this time, as described above with reference to FIG. 9, electrolytic copper plating film 56 of 20 μm in thickness is formed on the portion provided with no plating resist 54, while the members 20A and 20B move upward and downward. The members 20A and 20B are made of porous resin. The moving speed of the member is 7 m/min, the size of the member relative to the printed circuit board is 0.80, the proportion of contact of the member relative to the printed circuit board is 0.50, and the pressure applied to the member is 8 mm in terms of the amount of press in.

Figure 3D:
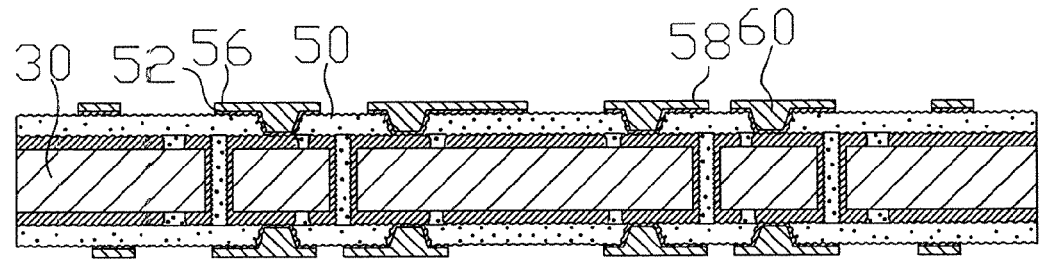

(13) After the plating resists 54 are peeled off with 5% KOH, the electroless plating films 52 under the plating resist films 54 are subjected to an etching treatment with a mixed solution of sulfuric acid and hydrogen peroxide, and are removed by dissolution, so that independent upper layer conductor circuits 58 (including filled vias 60) are produced (FIG. 3D).

Figure 4A:
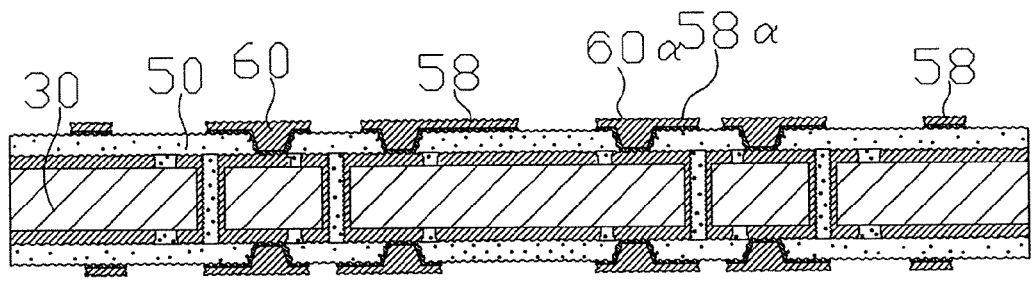
FIGS. 4A-4C illustrate the process for manufacturing the multilayer printed circuit board according to the embodiment of the present invention.

(14) A treatment similar to that in the above-described item (5) is conducted, so that roughened surfaces 58α and 6α are formed on the surfaces of the upper layer conductor circuits 58 and the filled vias 60 (FIG. 4A).

Figure 4B:
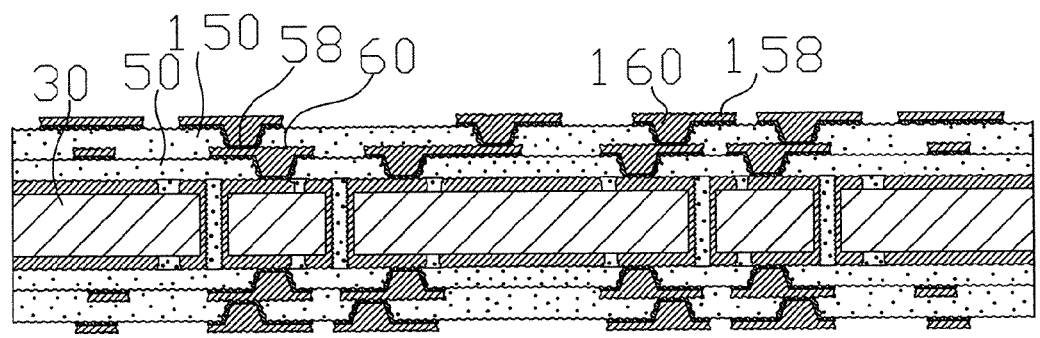
Figure 4C:
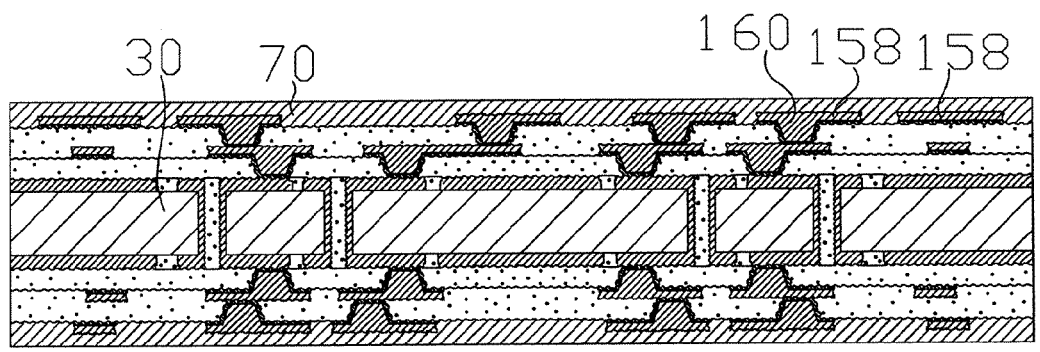

(15) The steps in the above-described items (6) to (14) are repeated and, thereby, further upper layers of interlayer insulating layers 150, conductor circuits 158, and filled vias 160 are formed, so that a multilayer circuit board is produced (FIG. 4B).

(16) A solder resist composition having a viscosity adjusted at 2.0 Pa·s at 25° C. is produced by dissolving 46.67 parts by weight of photosensitive oligomer (molecular weight: 4,000) in which 50% of epoxy groups of cresol novolac type epoxy resin (produced by Nippon Kayaku Co., Ltd.) is acrylated, 15.0 parts by weight of bisphenol A type epoxy resin (trade name: Epicoat 1001, produced by Yuka Shell Epoxy Co., Ltd.) dissolved in methyl ethyl ketone at 80 percent by weight, 1.6 parts by weight of imidazole curing agent (trade name: 2E4MZ-CN, produced by SHIKOKU CORPORATION), 4.5 parts by weight of photosensitive monomer, di-functional acrylic monomer (trade name: R604, produced by Nippon Kayaku Co., Ltd.), 1.5 parts by weight of photosensitive monomer, polyvalent acrylic monomer (trade name: DPE6A, produced by Kyoei Kagaku Kogyo K.K.), and 0.71 parts by weight of dispersion antifoaming agent (S-65, produced by San Nopco Limited) into diethylene glycol dimethyl ether (DMDG) in such a way that the concentration becomes 60 percent by weight, putting the resulting solution into a container, conducting agitation and mixing so as to prepare a mixed composition, and adding 2.0 parts by weight of benzophenone (produced by Kanto Kagaku) as a photopolymerization initiator and 0.2 parts by weight of Michler's ketone (produced by Kanto Kagaku) as a photosensitizer to this mixed composition.

The viscosity is measured by a Brookfield type viscometer (Model DVL-B, produced by Tokyo Keiki Co., Ltd.) with a rotor No. 4 in the case of 60 $min^{-1}$ and a rotor No. 3 in the case of 6 $min^{-1}$.

Figure 5A:
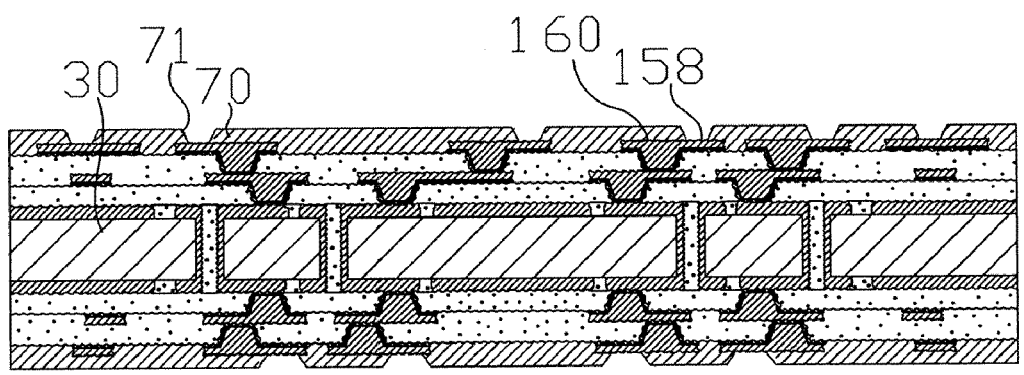
FIGS. 5A-5B illustrate the process for manufacturing the multilayer printed circuit board according to the embodiment of the present invention.

(17) The above-described solder resist composition 70 is applied by a thickness of 20 μm to both surfaces of the multilayer circuit board (FIG. 4C), and a drying treatment is conducted at 70° C. for 20 minutes and at 70° C. for 30 minutes. Thereafter, a photomask of 5 mm in thickness provided with a pattern of solder resist opening portions is adhered to the solder resist layer, exposure is conducted with an ultraviolet ray of 1,000 mJ/$cm^2$, and development is conducted with a DMTG solution, so that openings 71 of 200 μm in diameter are formed (FIG. 5A).

Furthermore, each of heat treatments on the condition of at 80° C. for 1 hour, at 100° C. for 1 hour, at 120° C. for 1 hour, and 150° C. for 3 hours is conducted to cure the solder resist layer, so that solder resist pattern layers 70 provided with openings and having a thickness of 20 μm are formed. Commercially available solder resist compositions may also be used as the above-described solder resist composition.

Figure 5B:
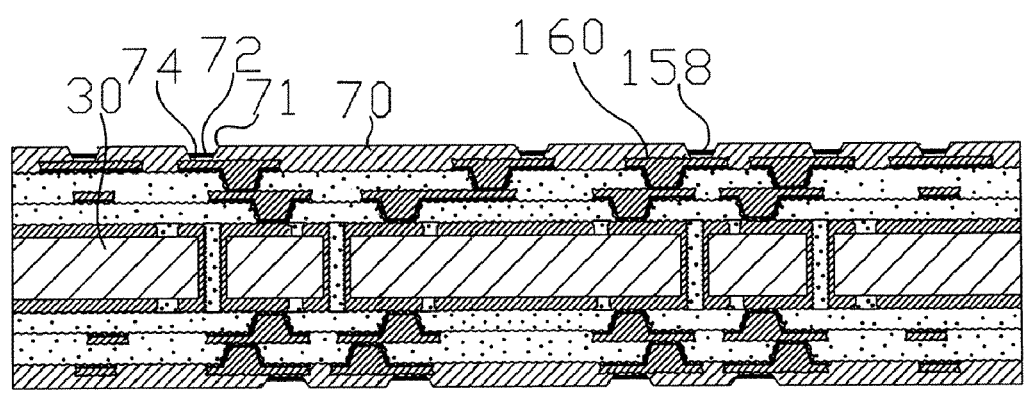

(18) The substrate provided with the solder resist layers 70 is immersed for 20 minutes in an electroless nickel plating solution of pH=4.5 containing nickel chloride ($2.3 \times 10^{-1}$ mol/l), sodium hypophosphite ($2.8 \times 10^{-1}$ mol/l), and sodium citrate ($1.6 \times 10^{-1}$ mol/l), so that nickel plating layers 74 of 5 μm in thickness are formed in the opening portions 71. Furthermore, the resulting substrate is immersed at the condition of 80° C. for 7.5 minutes in an electroless gold plating solution containing gold potassium cyanide ($7.6 \times 10^{-3}$ mol/l), ammonium chloride ($1.9 \times 10^{-1}$ mol/l), sodium citrate ($1.2 \times 10^{-1}$ mol/l), and sodium hypophosphite ($1.7 \times 10^{-1}$ mol/l), so that gold plating layers 72 of 0.03 μM in thickness are formed on the nickel plating layers 74 (FIG. 5B).

(19) Thereafter, a solder paste containing tin-lead is printed on the openings 71 of the solder resist layer 70 on the surface to be provided with IC chips of the substrate, and a solder paste containing tin-antimony is printed on the openings of the solder resist layer 70 on the other surface. Subsequently, solder bumps (solder elements) 76U and 76D are formed through reflow at 200° C., so that a multilayer printed circuit board having the solder bumps 76U and 76D is produced (FIG. 6).

Another production process according to Example 1-1-2 will be described below referring to FIGS. 7A-7D.

In the process shown in FIGS. 3A-3D, the plating resist 54 is disposed on the electroless plating film 52, and the electrolytic plating film 56 is formed on the portion provided with no plating resist. On the other hand, in the process shown in FIGS. 7A-7D, the electrolytic plating film 56 is formed all over the electroless plating film 52.

Figure 7A:
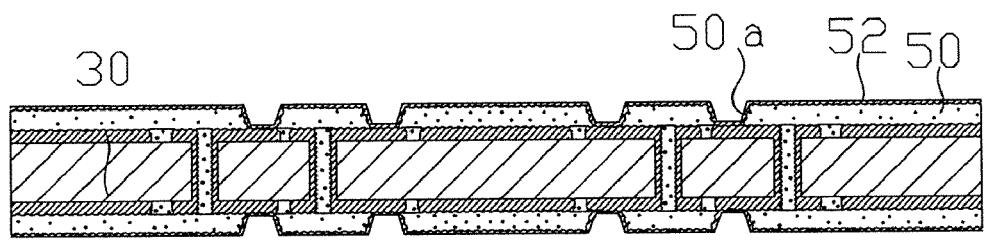
FIGS. 7A-7D illustrate a process for manufacturing a multilayer printed circuit board according to another embodiment of the present invention.

(10) The substrate 30 in which the electroless copper plating films 52 are formed on the surfaces of the interlayer resin insulating layers 50 including the inner walls of the openings 50a for via hole is produced (FIG. 7A).

Figure 7B:
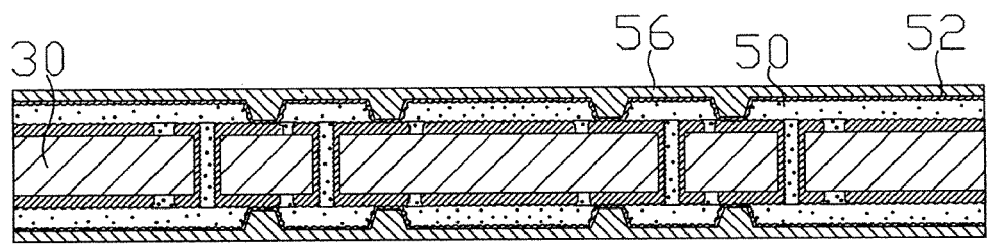

(11) The substrate 30 is washed with water at 50° C. to degrease, washed with water at 25° C., and furthermore, washed with sulfuric acid. Subsequently, electrolytic plating is conducted by using the plating apparatus 10 described above with reference to FIG. 9 on the following conditions, so that electrolytic plating films 56 are formed (FIG. 7B).

[Electrolytic Plating Solution]

| sulfuric acid | 2.24 mol/l |
| --- | --- |
| copper sulfate | 0.26 mol/l |
| additive | 19.5 ml/l |
| leveling agent | 50 mg/l |
| brightener | 50 mg/l |

[Electrolytic Plating Conditions]

| current density | 1 A/$dm^2$ |
| --- | --- |
| time | 65 minutes |
| temperature | 22° C. ± 2° C. |

At this time, as described above with reference to FIG. 9, the porous resin is used as the members 20A and 20B, and electrolytic copper plating films 56 of 20 μM in thickness are formed on the electroless plating films 52 while the plating target surface is moved vertically. The moving speed of the member is 7 m/min. A ratio of a first length to a second length is 1.0, wherein the member has the first length in a second direction perpendicular to the moving direction MD (see FIGS. 11A and 11B) of the member, and the surface has the second length in the second direction. The member has a facing area facing the surface to be plated and a contact area configured to contact the surface, and a contact ratio of the contact area to the facing area is 0.50. The member is pressed to the surface to contract by 8.0 mm.

Figure 7C:
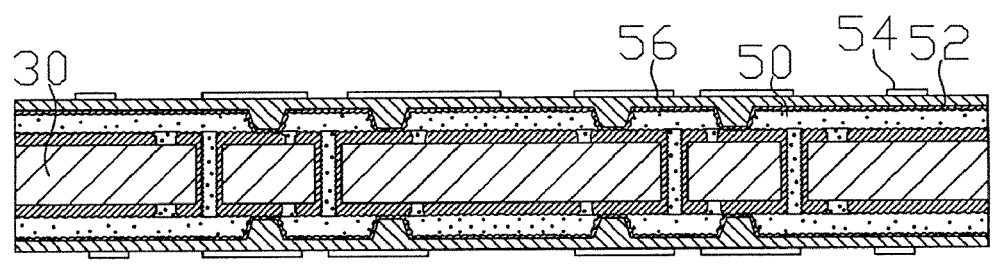

(12) Etching resists 54 are disposed on the substrate 30 provided with the electrolytic copper plating films 56 (FIG. 7C).

Figure 7D:
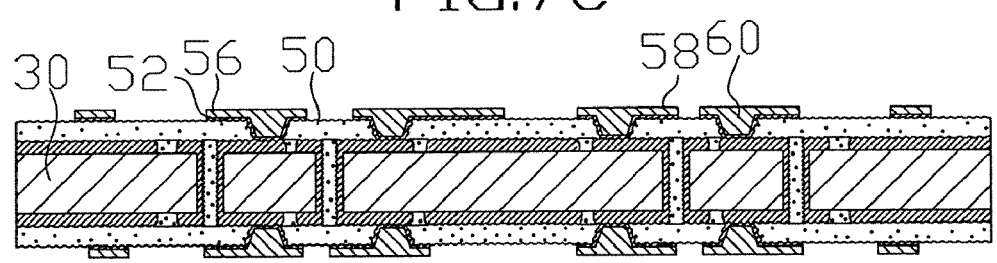

(13) The electrolytic plating films 56 and the electroless plating films 52 on the portion provided with no etching resist 54 are removed by etching and, thereafter, the etching resists 54 are removed by dissolution, so that independent upper layer conductor circuits 58 (including filled vias 60) are produced (FIG. 7D).

Another production process according to Example 1-1-3 will be described below with reference to FIGS. 8A-8D.

In the example described referring to FIGS. 3A-3D, the filled vias 60 are produced by using the plating apparatus 10. On the other hand, in the present example, through holes are formed.

Figure 8A:
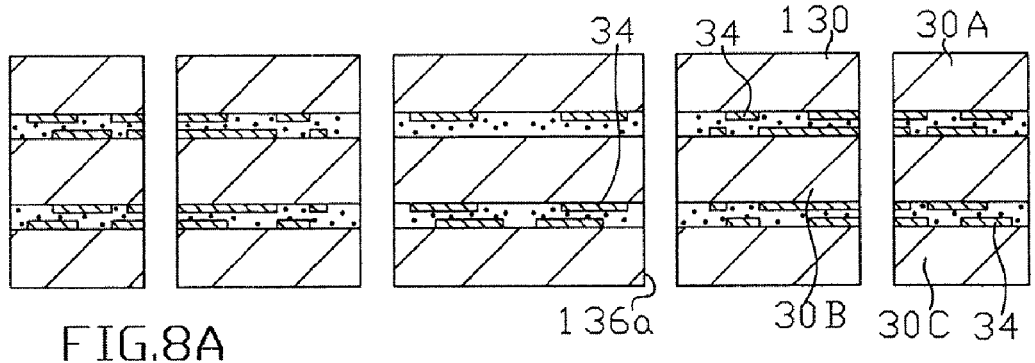
FIGS. 8A-8D illustrate a process for manufacturing a multilayer printed circuit board according to another embodiment of the present invention.
Figure 8B:
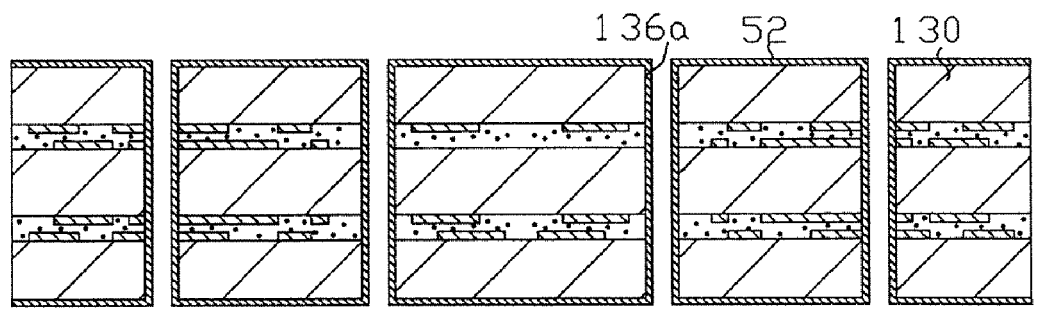
Figure 8C:
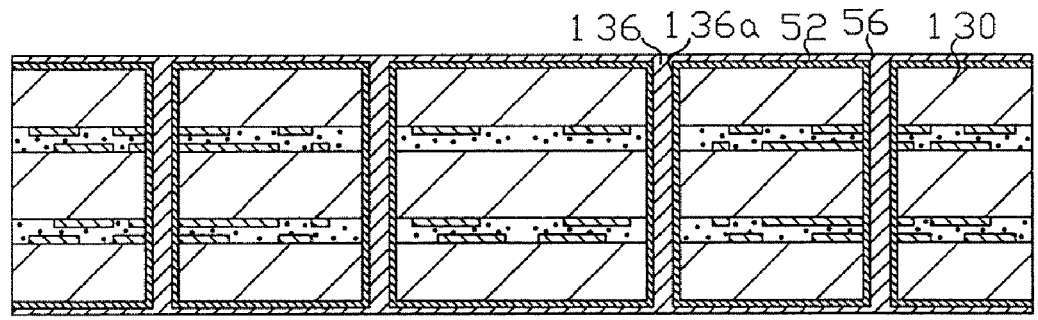

(1) Penetration holes 136a for through hole are bored in a laminated substrate 130 produced by laminating core substrates 30A, 30B, and 30C provided with conductor circuits 34 (FIG. 8A).

(2) An electroless plating film 52 is formed all over the laminated substrate 130 and in the penetration holes 136a for through hole.

(3) An electrolytic copper plating film 56 is formed on the surface of the laminated substrate 130 with the plating apparatus 10 in Example 1-1-1 described above with reference to FIG. 9 and, in addition, the electrolytic copper plating film 56 is filled in the penetration holes 136a for through hole. The moving speed of the member is 7 m/min. The ratio of a first length to a second length is 1.20. The contact ratio of the contact area to the facing area is 1.0. The member is pressed to the surface to contract by 8.0 mm.

Figure 8D:
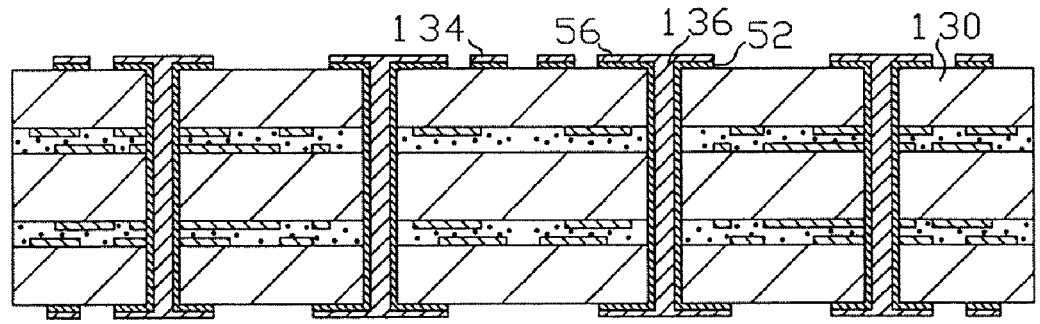

(4) After an etching resist is formed, the electrolytic plating film 56 and the electroless plating film 52 on the portion provided with no etching resist are removed by etching. Subsequently, the etching resist is removed by dissolution, so that independent upper layer conductor circuits 134 (including through holes 136) are produced (FIG. 8D).

EXAMPLE 1-2-1

Figure 10:
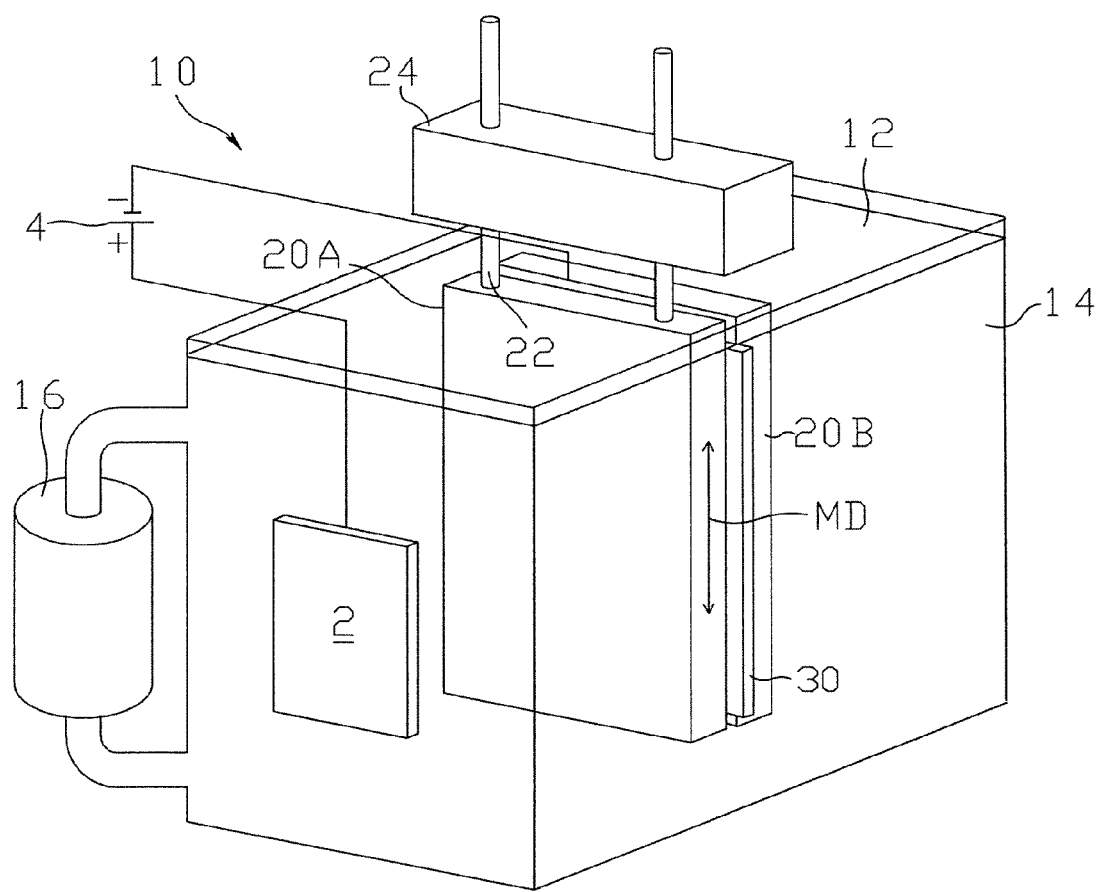
FIG. 10 is a schematic perspective view of a plating apparatus according to another embodiment of the present invention.

FIG. 10 shows a plating apparatus 10 according to another embodiment of the present invention. In Example 1-1-1 described above with reference to FIG. 9, the members 20A and 20B are configured to be brought into contact with only a part of the printed circuit board 30. On the other hand, in Example 1-2-1, the members 20A and 20B are configured to slide vertically while being in contact with all over the surface of the printed circuit board 30. At this time, the moving speed of the member is 6 m/min. The ratio of a first length to a second length is 1.20. The contact ratio of the contact area to the facing area is 1.0. The member is pressed to the surface to contract by 8.0 mm.

EXAMPLE 2-1-1

In the plating apparatus of Example 1-1-1 described above with reference to FIG. 9, the members 20A and 20B are composed of a porous resin. On the other hand, in Example 2-1-1, the members 20A and 20B are composed of porous ceramic (SiC). At this time, the moving speed of the member is 5 m/min. The ratio of a first length to a second length is 0.9. The contact ratio of the contact area to the facing area is 0.5. The member is pressed to the surface to contract by 1.0 mm.

EXAMPLE 2-2-1

In Example 2-2-1, the electrolytic plating film is formed with the plating apparatus while the moving speed of the member is 7 m/min, the ratio of a first length to a second length is 1.20, the contact ratio of the contact area to the facing area is 1.0, and the member is pressed to the surface to contract by 1.0 mm.

EXAMPLE 3-1-1

In the plating apparatus of Example 1-1-1 described above with reference to FIG. 9, the members 20A and 20B are composed of a porous resin. On the other hand, in Example 3-1-1, the members 20A and 20B are composed of a PVC (vinyl chloride) brush in which the ends of the fibers are brought into contact with the printed circuit board side. At this time, the electrolytic plating film is formed while the moving speed of the member is 6 m/min, the ratio of a first length to a second length is 1.5, the contact ratio of the contact area to the facing area is 0.75, and the member is pressed to the surface to contract by 2.0 mm.

EXAMPLE 3-2-1

In Example 3-2-1, the electrolytic plating film is formed with the plating apparatus while the moving speed of the member is 6 m/min, the ratio of a first length to a second length is 1.0, the contact ratio of the contact area to the facing area is 0.75, and the member is pressed to the surface to contract by 2.0 mm.

EXAMPLE 4-1-1

In the plating apparatus of Example 1-1-1 described above with reference to FIG. 9, the members 20A and 20B are composed of a porous resin. On the other hand, in Example 4-1-1, the members 20A and 20B are composed of a vinyl chloride woven fabric. At this time, the electrolytic plating film is formed while the moving speed of the member is 7 m/min, the ratio of a first length to a second length is 1.0, the contact ratio of the contact area to the facing area is 1.0, and the member is pressed to the surface to contract by 8.0 mm.

EXAMPLE 4-2-1

In Example 4-2-1, the electrolytic plating film is formed with the plating apparatus while the moving speed of the member is 7 m/min, the ratio of a first length to a second length is 1.2, the contact ratio of the contact area to the facing area is 1.0, and the member is pressed to the surface to contract by 8.0 mm.

EXAMPLE 5-1-1

In the plating apparatus of Example 1-1-1 described above with reference to FIG. 9, the members 20A and 20B are composed of a porous resin. On the other hand, in Example 5-1-1, the members 20A and 20B are composed of a tabular material made of rubber. At this time, the electrolytic plating film is formed while the moving speed of the member is 5 m/min, the ratio of a first length to a second length is 1.2, the contact ratio of the contact area to the facing area is 0.5, and the member is pressed to the surface to contract by 4.0 mm.

EXAMPLE 5-2-1

In Example 5-2-1, the electrolytic plating film is formed with the plating apparatus while the moving speed of the member is 7 m/min, the ratio of a first length to a second length is 1.1, the contact ratio of the contact area to the facing area is 1.05, and the member is pressed to the surface to contract by 7.0 mm.

<Evaluation Test>

Filled vias are formed in Example 1-1-1 to Example 5-1-1 and by using a plating apparatus of known technology, and are evaluated. The results are shown in FIG. 13.

Evaluation are performed on (1) the filling state in the via hole, (2) the property (the case where copper crystals are aligned neatly as described above with reference to FIG. 12 is indicated by ○, and the case where copper crystals are not aligned neatly as described above with reference to FIG. 16 is indicated by x, (3) the value of resistance (the case where the measured value of resistance is less than or equal to the allowable value is indicated by ○, and the case where the measured value of resistance exceeded the allowable value is indicated by x, and (4) the heat cycle test (conditions: −55° C.×5 minutes to 125° C.×5 minutes, the number of cycles: 1,000 times, criteria: the case where the change in resistivity after the test is ±10% or less is indicated by ○, and the case where the change in resistivity exceeded 10% is indicated by x.

Figure 17:
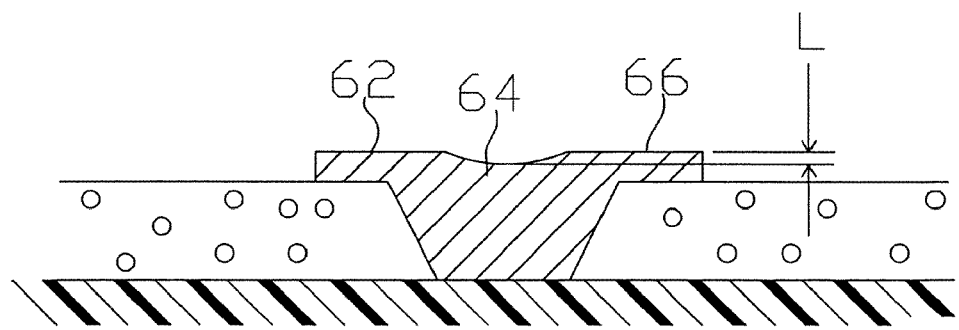
FIG. 17 is a cross-sectional view of a filled via according to an embodiment of the present invention.

Regarding the filling state in the via hole, referring to FIG. 17, the case where all of the filled vias having upper surfaces 62 such that a distance L between a lowest surface 64 and a highest surface 66 of each of the upper surfaces 62 is less than or equal to about 7 μm is indicated by ○. If the distance L is less than or equal to about 7 μm, even though a via hole is formed on a filled via, there is no problem in electrical properties.

As is clear from the results of the evaluation, according to the embodiments of the present invention, the value of resistance is controlled within an allowable value, and high reliability is exhibited against the heat cycle.

In addition to this evaluation test, the thicknesses of the conductor circuits of the printed circuit boards of Examples and Comparative example are measured. In Example 1-1-1 to Example 5-1-1, the thickness of the conductor circuit 58 (indicated by h1 shown in FIG. 11C) can be made smaller.

In the above-described Examples, the plating apparatus of the present example is used for production of via holes and through holes. However, the plating apparatus of the present example is suitable for application to the production of various sites of the printed circuit board.

In a plating apparatus according to embodiments of the present invention, electrolytic plating is performed while a member or a circuit board is relatively moved to change an area of a surface to be plated covered by the member.

Conventionally, an article to be plated is simply immersed in a plating solution. Therefore, fluctuations in liquid flow, irregular occurrence of bubbles, and the like cannot be eliminated during formation of a plating film. Consequently, the plating film cannot be made uniform. In particular, the growth of the plating film on the periphery of the via hole cannot be made uniform. As a result, a filled via having a dent may be produced. As for the tendency thereof, a frequency of occurrence tends to be increased in the case where the via hole diameter is decreased (150 μm or less) or a pitch between via holes is small.

The growth of the plating film cannot be heretofore made uniform in the formation of a plating film in a through hole that is a penetration hole. Consequently, variations of the film in the through hole may occur or the flatness of the surface layer portion of the through hole may be deteriorated. As for the tendency thereof, a frequency of occurrence tends to be increased in the case where a plating film is formed in a through hole that is a penetration hole having a diameter of less than 300 μm, or the penetration hole is filled in with plating.

In the embodiments according to the present invention, the member is brought into contact with or partial contact with the surface to be plated and, thereby, the growth of plating film becomes slow or the growth of plating film is stopped at the contact portion or the covered portion. On the contrary, the plating film grows at the portion not brought into contact with the member. Consequently, the plating grows at open portions, e.g., a via hole and a through hole, and a conductor circuit that is a conductor portion other than the via hole does not become too thick. That is, the plating is formed reliably in the via hole and the through hole, whereas a plating film having a relatively small thickness can be formed at the conductor circuit portion other than them as compared with the thickness in the via hole and the thickness at a conductor circuit portion based on the known technology. In this manner, a higher density conductor circuit can be formed than ever.

The member is initially not in contact with the periphery of the via hole or the through hole. However, when a plating film is formed on the periphery portion, the height becomes the same as the height of the other conductor portion. Since the member is brought into contact at the point in time when the height becomes uniform, the growth of plating film is suppressed or the growth of plating film is stopped. As a result, the heights of the via hole (or through hole) and the conductor circuit become uniform.

The liquid flow of the plating solution can be directed in a constant direction by bring the member into contact with the plating target surface (the surface to be plated) or moving the member. In particular, the liquid flow on the periphery of the via hole can be directed in a constant direction and the amount of supply can be stabilized. Therefore, variations in formation of the plating film on the periphery of the via hole can be eliminated. Consequently, in the case where a via hole is formed, any dent of the via hole is not formed, and in the case where a through hole is formed, a shoulder portion, that is, a surface layer, of the through hole is not deformed.

In the plating apparatus according to embodiments of the present invention, a plating solution is fed to a via hole or a through hole at some midpoint in the formation. Consequently, the plating solution is fed to the via hole or the through hole intentionally, the contact of the plating solution with the plating target surface is increased and, therefore, the growth of plating film is not hindered.

Put another way, an irregular liquid flow due to the member or the like is not formed on the periphery of the via hole or the through hole. Therefore, an internal crystal structure of the formed plating film is aligned. The internal resistance in the inside of the plating film can be reduced than ever. Consequently, the electrical connectivity is improved and, when a reliability test is performed on a high-temperature high-humidity condition or a heat cycle condition, the reliability tends to be ensured than ever over the long term. The same tendency is observed with respect to the through hole.

These members may be moved along the plating target surface. In this case, the members may be moved relative to the plating target surface in vertical and horizontal directions of a substrate, or the member may be moved in directions different from vertical and horizontal directions (for example, in a slanting direction). Conversely, the member may be moved relatively by moving the plating target surface.

In addition to this, a desired result can be attained by adjusting the moving speed of the member, the size of the member, the proportion of contact of the member with the plating target surface, and the like.

Desirably, the moving speed of the member is about 1.0 to about 8.0 m/min. If the speed is less than about 1.0 m/min, the liquid flow may not be changed and, therefore, the result may be the same as that in the case where no member is used. If the speed exceeds about 8.0 m/min, the moving speed of the member is increased and, therefore, the liquid flow may not be changed. Consequently, the result is inferior to that in the case where the member is moved. The most desirable moving speed is about 5.0 to about 7.0 m/min, and when the speed is within that range, it does not occur even locally that the liquid flow cannot be changed.

The moving device is configured to move the member or the surface in a moving direction (MD). The member has a first length in a second direction perpendicular to the moving direction. The surface to be plated has a second length in the second direction. A ratio of the first length to the second length is at least about 0.9 and at most about 1.5. If the ratio is less than 0.9, the effect of the member does not reach both end portions and, therefore, the result may be the same as that in the case where no member is used. If the ratio exceeds 1.5, feeding of the plating solution to the substrate is hindered and, therefore, variations in plating film in the via hole or the through hole may result. More preferably, the ratio is about 1.0 to about 1.2, since variations in plating film are resistant to occurrence.

The member has a facing area facing the surface to be plated and a contact area configured to contact the surface. A contact ratio of the contact area to the facing area is at least about 0.25 and at most about 1.0.

If the proportion of contact is less than 0.25, the effect of the member does not reach both end portions and, therefore, the result may be the same as that in the case where no member is used. More preferably, the contact ratio is at least about 0.5 and at most about 1.0, since variations in plating film are resistant to occurrence.

The member is pressed to the surface to contract by at least about 1.0 mm and at most about 15.0 mm. If the amount of press in is less than 1.0 mm, the result may be the same as that in the case where no member is used. If the amount of press in exceeds 15.0 mm, feeding of the plating solution is hindered and, therefore, variations in plating film in the via hole or the through hole may result. More preferably, the member is pressed to the surface to contract by at least about 2.0 mm and at most about 8.0 mm.

It is desirable that electrolytic plating is conducted while a member is brought into contact with or partial contact with a plating target surface, or the member is moved relative to the plating target surface.

In this manner, the plating film formed in the via hole and the through hole becomes into a desired shape, and the flatness of the surface layer portion is ensured. Since the orientation of the formed plating film is aligned reliably, defects and the like are resistant to occurrence in the plating film itself. Therefore, electric characteristics and electrical connectivity are not deteriorated.

Furthermore, even when a reliability test is conducted, reduction of the reliability at an early stage is not observed.

In this case, desirably, the member is selected from, for example, any one of a long fiber, a porous material, and a fibrous material.

A metal may be formed all over the plating target surface. After the metal film is formed all over the surface, a desired circuit pattern (conductor circuit) may be formed by etching or the like.

A via hole or a through hole may be formed by electrolytic plating. At this time, a resist may be used and the desired circuit pattern may be formed on the portion provided with no resist.

A resin brush may be used as the long fiber constituting the member. In this case, the ends of the fibers are brought into contact with the plating target surface. Plating agent-resistant PP, PVC (vinyl chloride), +PTFE (tetrafluoroethylene), and the like may be used as the resin brush. Resins and rubber may be used.

Porous ceramic, e.g., SiC, sponge, a porous resin, e.g., PE (polyethylene), may be used as a porous material constituting the member. It is possible to use, for example, a material in which micropores are formed in the inside of a polyimide film by applying a tension, as the porous resin.

Furthermore, it is also possible to use a resin fiber, e.g., vinyl chloride woven fabric and nonwoven fabric, as the fibrous material constituting the member.

It is also suitable to slide the member relative to the plating target surface. In this manner, the plating solution can be further uniformly circulated to a plating formation portion of the via hole and the like, and a flat filled via can be formed.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a multilayer printed circuit board, comprising:
   providing a core substrate having a penetrating-hole for a through-hole conductor structure;
   forming an electroless plated film on a surface of the core substrate and an inner wall surface of the penetrating-hole;
   electrolytically plating the core substrate while moving with respect to the surface of the core substrate an insulating member in contact with the surface of the core substrate such that an electrolytic plated film is formed on the electroless plated film, an opening space inside the penetrating-hole is filled with an electrolytic material, and a through-hole conductor structure is formed in the penetrating-hole;
   forming an etching resist having an opening pattern on the electrolytic plated film; and
   removing an exposed pattern of the electrolytic plated film exposed by the opening pattern of the etching resist and a pattern of the electroless plated film under the exposed pattern of the electrolytic plated film such that a conductor circuit is formed on the surface of the core substrate.

2. A method for manufacturing a multilayer printed circuit board according to claim 1, wherein the providing of the core substrate comprising forming the penetrating-hole having a diameter of 150 µm or less.

3. A method for manufacturing a multilayer printed circuit board according to claim 1, wherein the electrolytically plating comprises moving the insulating body with respect to the surface of the core substrate such that a flow of an electrolytic plating solution is controlled to be substantially constant.

4. A method for manufacturing a multilayer printed circuit board according to claim 1, wherein the insulating member comprises one of a porous ceramic and a porous resin.

5. A method for manufacturing a multilayer printed circuit board according to claim 1, wherein the insulating member comprises rubber.

6. A method for manufacturing a multilayer printed circuit board according to claim 1, wherein the moving of the insulating member comprises moving one of the insulating member and the core substrate in upward and downward directions at a speed of at least about 1.0 m/min. and at most about 8.0 m/min.

7. A method for manufacturing a multilayer printed circuit board according to claim 1, wherein the moving of the insulating member comprises moving one of the insulating member and the core substrate in upward and downward directions at a speed of at least about 5.0 m/min. and at most about 7.0 m/min.

8. A method for manufacturing a multilayer printed circuit board according to claim 1, wherein the moving of the insulating member comprises sliding the insulating member on the surface of the core substrate.

9. A method for manufacturing a multilayer printed circuit board according to claim 1, wherein the insulating member comprises a sponge.

10. A method for manufacturing a multilayer printed circuit board according to claim 1, wherein the insulating member is positioned in a plating bath such that the insulating member presses against the surface of the core substrate.

11. A method for manufacturing a multilayer printed circuit board according to claim 1, wherein the insulating member comprises a sponge, and the insulating member is pressed to the surface of the core substrate by at least about 1.0 mm and at most about 15.0 mm.

* * * * *